United States Patent
Shao et al.

(10) Patent No.: US 7,113,412 B2
(45) Date of Patent: Sep. 26, 2006

(54) DRIVE CIRCUIT AND POWER SUPPLY APPARATUS

(75) Inventors: Geliang Shao, Saitama (JP); Kiyoshi Obikata, Saitama (JP); Kimio Yoshimi, Saitama (JP); Kazunori Matsuzawa, Saitama (JP); Masaru Kubota, Saitama (JP)

(73) Assignee: Tamura Corporation, Tokyo (JP)

( * ) Notice: Subject to any disclaimer, the term of this patent is extended or adjusted under 35 U.S.C. 154(b) by 0 days.

(21) Appl. No.: 11/093,332

(22) Filed: Mar. 29, 2005

(65) Prior Publication Data

US 2005/0231989 A1    Oct. 20, 2005

(30) Foreign Application Priority Data

Mar. 30, 2004  (JP)  .............................. 2004-099459

(51) Int. Cl.
*H03K 17/04*    (2006.01)
*H03K 17/16*    (2006.01)

(52) U.S. Cl. .................. 363/18; 327/389; 327/542

(58) Field of Classification Search .................. 363/18, 363/19; 327/381, 389, 542
See application file for complete search history.

(56) References Cited

U.S. PATENT DOCUMENTS 4,748,351 A * 5/1988 Barzegar .................... 327/384
5,438,294 A * 8/1995 Smith ......................... 327/384
5,481,219 A * 1/1996 Jacobs et al. ............... 327/434
5,699,237 A * 12/1997 Seragnoli .................... 363/19
6,072,702 A * 6/2000 Nakao et al. ................. 363/19

FOREIGN PATENT DOCUMENTS

JP   08-149796   6/1996
JP   11-145810   5/1999

* cited by examiner

*Primary Examiner*—Bao Q. Vu
(74) *Attorney, Agent, or Firm*—Knobbe Martens Olson & Bear LLP

(57) ABSTRACT

In charging a gate of a NMOS transistor Q1, the charging speed is adjustable by varying a resistor R1. When an inputted pulse signal VIN reverses to a negative voltage, a diode D2 turns off. Then, current flows along a discharging loop formed by the gate capacitor, the resistor R1, the emitter of the transistor Q2, the base of the transistor Q2, the resistor R2 and the capacitor C1, the transformer T1 and the source of the NMOS transistor Q1. A reverse bias voltage is applied to the gate of the NMOS transistor Q1, thereby keeping the NMOS transistor Q1 off-state stably.

5 Claims, 4 Drawing Sheets

DRIVE CIRCUIT AND POWER SUPPLY APPARATUS

CROSS REFERENCES TO RELATED APPLICATIONS

The present invention contains subject matter related to Japanese Patent Application No. JP 2004-99459 filed in the Japanese Patent Office on Mar. 30, 2004, the entire contents of which being incorporated herein by reference.

BACKGROUND OF THE INVENTION

1. Field of the Invention

The present invention relates to a drive circuit and a power supply apparatus having a switch element such as MIS-FET (Metal Insulation Semiconductor—Field Effect Transistor), IGBT (Insulated Gate Bipolar Transistor) or the like, more particularly to an improved technique for switching the switch element at a high speed.

2. Description of the Related Art

Generally, in drive circuits having a voltage-driven type switch element such as a MIS-FET, an IGBT or the like, controllability of the drive circuits can be improved by driving a gate voltage at a high speed, thereby shortening a switching time of the switch element.

Further, when the drive circuits receive a negative voltage of a pulse signal, a method is performed which applies a reverse bias voltage to the switch element in order to abruptly turn off the switch element.

From the above view point, a variety of techniques have been disclosed relating to drive circuits for a switch element.

For example, Japanese Unexamined Patent Publication (Kokai) No. H08(1996)-149796 discloses a technology of drive circuits having a capacitor in series between a secondary winding of a transformer and a switch element, thereby applying a reverse bias voltage generated by the capacitor to a gate of the switch element, and limiting amplitude of the reverse bias voltage by a Zenor diode connected in parallel with the capacitor.

Japanese Unexamined Patent Publication (Kokai) No. H11(1999)-145810 discloses a technology of drive circuits connecting a capacitor and a diode in series between a secondary winding of a transformer and a voltage-driven type switch element, and connecting a base and an emitter of a discharging transistor to both terminals of the diode without a current-limiting resistor, thereby turning on the discharging transistor at a high speed when the switch element is off-state, which allows the gate capacitor to be discharged at a high speed.

According to the technology disclosed in Japanese Unexamined Patent Publication (Kokai) No. H08(1996)-149796, a reverse bias voltage is generated for applying the gate of the switch element. However, when an input voltage is reversed and a gate capacitor of the switch element is discharged, a large current flows through the gate, the capacitor and the transformer (inductance). Therefore, it suffers from a disadvantage that a large level of a LC resonance appears.

Moreover, when an input voltage is reversed, a time constant of the discharge is long in a discharging loop formed by the gate (gate capacitor), the capacitor and the transformer (inductance). Therefore, it also suffers from a disadvantage that power dissipation (consumption) is large.

According to the technology disclosed in Japanese Unexamined Patent Publication No. H11-145810, a current-limiting resistor is not provided and impedance of a discharging loop from the gate capacitor is small when the switch element is off-state. As a result, it suffers from a disadvantage that a large level of a LC resonance may appear and power dissipation is large because of a large current that appears due to the small impedance.

Further, since a power loss of the discharging transistor becomes large under high temperature range, power dissipation may be even larger.

SUMMARY OF THE INVENTION

It is desirable to provide a drive circuit and a power supply apparatus small in power dissipation, reducing a level of resonance, and usable under extensive operating temperature range.

According to the present invention, there is provided a drive circuit including: a transformer having a primary winding to which a pulse is applied and a secondary winding, the secondary winding having one terminal connected to a reference terminal; a first switch element having a first control terminal, and switching between an output terminal and the reference terminal in response to said pulse; a first node provided between the other terminal of the secondary winding of the transformer and the first control terminal; a first diode connected between the other terminal of the secondary winding of the transformer and the first node; a first resistor connected between the first node and the first control terminal; a second diode, one terminal of the second diode connected to the reference terminal; a second switch element connected between the first node and the other terminal of the second diode, having a second control terminal and controlling a current flow of the second diode; a capacitor; and a second resistor, the capacitor and the second resistor being connected in parallel each other between the other terminal of the secondary winding of the transformer and the second control terminal.

In the drive circuit according to the present invention, when the first control terminal of the first switch element is discharged, time for discharging is adjusted by the first resistor. Therefore, time for turning on the first switch element is adjustable by changing a value of the first resister.

When the pulse reverses to a negative voltage, the first diode turns off and the second diode turns off. Accordingly, a reverse bias voltage, which depends on the first resistor, the second resistor and the capacitor, is applied to the first switch element, thereby keeping the first switch element off-stable stably.

At this time, the electrical signal that appears at the second control terminal is very small. Consequently, power dissipation becomes small, and a level of resonance, which is caused by inductance of the transformer and the capacitor, is limited.

Preferably, the drive circuit further has a third diode of which permitted current flow is opposite to that of the first diode. The third diode is connected in parallel with the first resistor. Due to the third diode, the first control terminal is quickly discharged, thereby turning off the first switch element at a high speed.

Preferably, the drive circuit further has a third resistor connected between the second control terminal and the first node. The third resistor improves an operation under high temperature environment. As a result, the drive circuit is usable in extensive temperature environment.

Preferably, the second switch element is a bipolar type transistor. In the case in which the second switch element is a bipolar type transistor, a base current that flows through the transformer is very small when the inputted pulse reverses to a negative voltage. Accordingly, power dissipation is small in the transformer, and a level of resonance is limited.

BRIEF DESCRIPTION OF THE DRAWINGS

These and other objects and features of the present invention will be described in more detail with reference to the accompanying drawings, in which.

DESCRIPTION OF THE PREFERRED EMBODIMENTS

Below, the preferred embodiments of a drive circuit according to the present invention will be described with reference to the attached drawings.

FIRST EMBODIMENT

Figure 1:
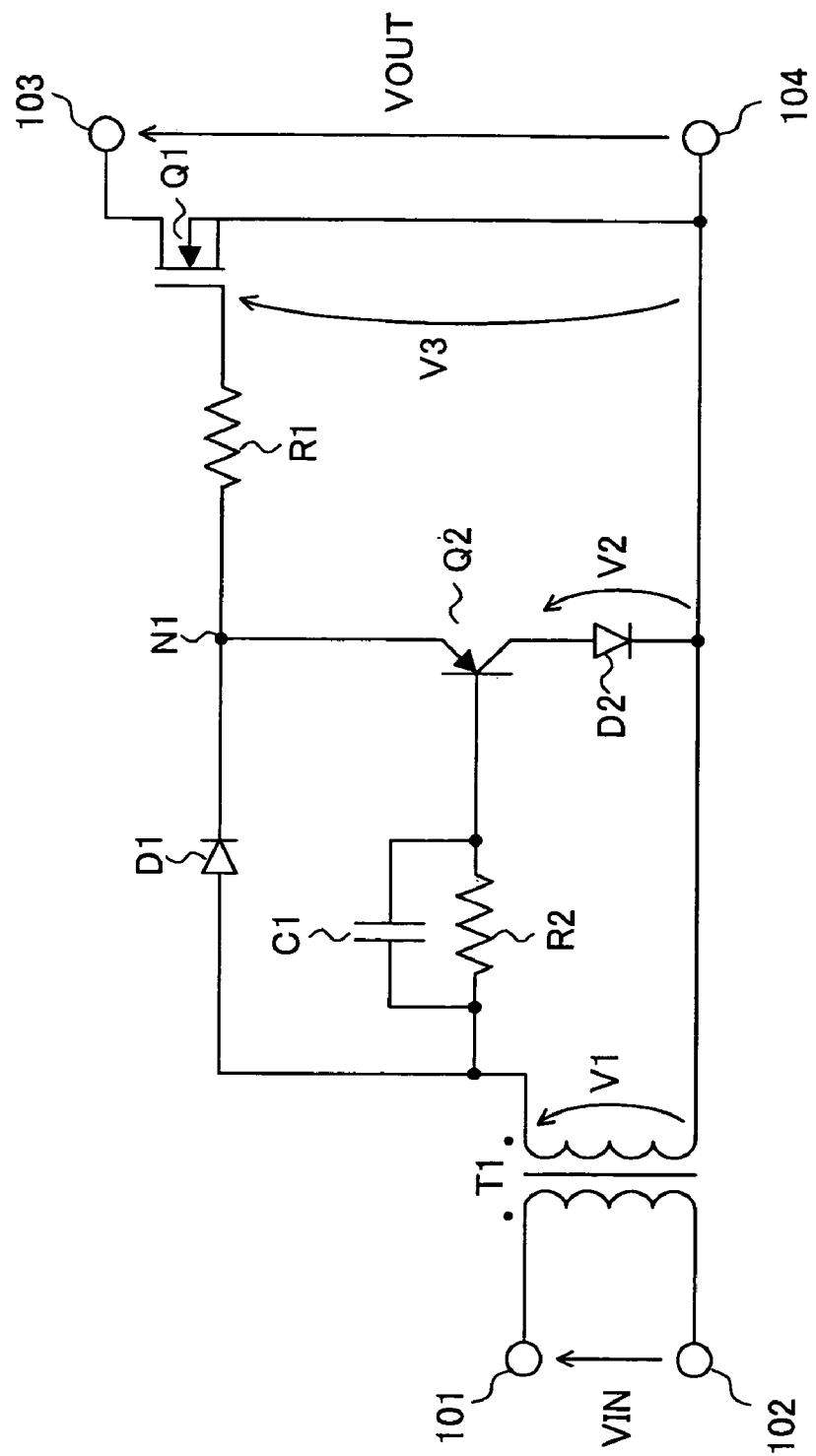
FIG. 1 is a circuit diagram of drive circuit according to a first embodiment of the present invention.

FIG. 1 is a circuit diagram of drive circuit 1 according to the first embodiment of the present invention. Note that, in FIG. 1, a node N1 corresponds to a first node in the present invention.

In FIG. 1, a terminal 101 and a terminal 102 constitutes input terminals of the drive circuit 1. An external pulse generating circuit supplies a pulse signal (input signal VIN) of which positive level and negative level are the same.

Both terminals of the primary winding of the transformer T1 are connected to the input terminals respectively. That is, the transformer T1 is excited by the input signal VIN. As a result, a voltage is generated in response to the input signal VIN in the secondary winding of the transformer T1.

Both terminals of the secondary winding of the transformer T1 are connected, via a diode D1 and a resistor R1, to a gate (first control terminal) and a source (reference terminal) of a NMOS transistor Q1 respectively.

The diode D1 is connected so that a positive voltage outputted from the secondary winding of the transformer T1 is applied to the gate of the NMOS transistor Q1. That is, an anode of the diode D1 is connected to one terminal of the secondary winding of the transformer T1, and a cathode of the diode D1 is connected to the gate of the NMOS transistor Q1.

The resistor R1 is connected between the cathode of the diode D1 and the gate of the NMOS transistor Q1, thereby enabling rise time of the gate voltage V3 to be adjustable.

Further, the resistor R1 functions as a current-limiting resistor that increases impedance of a discharging loop, when the NMOS transistor Q1 is discharged. This limits a resonance level of the drive circuit 1.

As will be described later, the transistor Q2 functions as a controlling transistor that controls the drive circuit 1 so that the NMOS transistor Q1 turns off at a high speed. From this view point, as shown in FIG. 1, the transistor Q2 is formed by a PNP type bipolar transistor, for example.

As shown in FIG. 1, the transistor Q2 has a base connected to the secondary winding of the transformer T1 via the capacitor C1 and the resistor R2, an emitter connected to the secondary winding of the transformer T1, and a collector connected to the reference potential node via the diode D2.

Note that, in the drive circuit 1 according to the present embodiment, a bipolar type transistor (not FET) is applied as the transistor Q2, in order to reduce a peak current which appears when it is on, thereby limiting a resonance level.

As shown in FIG. 1, the capacitor C1 and the resistor R2 are connected in parallel each other between one terminal of the secondary winding of the transformer T1 and the base of the transistor Q2.

The capacitor C1 is a so-called "speedup capacitor" that turns on/off the transistor Q2 abruptly, bypassing the resistor R2, when the secondary voltage V1 of the transformer T1 rises/falls abruptly.

The NMOS transistor Q1 functions as a switch element that drives a load (not shown) connected to an output terminal (output voltage:VOUT) formed by a terminal 103 and a terminal 104.

The gate of the NMOS transistor Q1 is connected to the secondary winding of the transformer T1. Therefore, the NMOS transistor Q1 is controlled by the input signal VIN via the transformer T1.

The drain and the source of the NMOS transistor Q1 are connected to the terminal 103 and the terminal 104 respectively, thereby driving a load (not shown).

Note that, in the following description, a gate capacitance of the gate of the NMOS transistor Q1 will be called "Giss". It is a matter of course that, if the NMOS transistor Q1 was replaced with the other voltage-driven type switch element such as an IGBT or the like, such the switch element would operate in a similar manner.

Next, an operation of the drive circuit 1 will be described with reference to FIG. 1 and FIG. 2A to 2C.

FIG. 2A and 2C are timing charts that illustrate the operation of the drive circuit according the first embodiment. FIG. 2A is a timing chart of the secondary voltage V1 of the transformer T1. FIG. 2B is a timing chart of the collector voltage V2 of the transistor Q2. FIG. 2C is a timing chart of the gate voltage V3 of the NMOS transistor Q1. Note that, as not shown in FIG. 2A to 2C, a pulse signal having a cycle of time t0 to t8 is applied to the drive circuit.

Below, the operation of the drive circuit 1 will be described in a time sequence of FIG. 2A to 2C.

TIME t0 to t1

When a positive input signal VIN is applied, as shown in FIG. 2A, the secondary voltage V1 rises. As a result, the gate capacitor (Giss) of the NMOS transistor Q1 is charged via the diode D2 and the resistor R1. Further, due to the speedup capacitor C1, the transistor Q2, which is on-state before t1, turns off abruptly.

A time constant in charging the gate capacitor (Giss) of the NMOS transistor Q1 depends on the resistor R1 and the gate capacitor ($\tau$=Giss*R1). Therefore, as shown in FIG. 2C, the gate voltage V3 of the NMOS transistor Q1 rises gradually with the above time constant $\tau$.

A rise time of the gate voltage V3 is easily adjustable by adjusting a value of the resistor R1.

Specifically, when a so-called "soft switching" is performed in ZVS (Zero Volt Switching) system, noise accompanied by a peak current is unlikely to occur in charging the gate capacitor (Giss), because a required rise time of a drive voltage is long.

TIME t1 to t2

The input signal VIN becomes a positive high level (H-level) at t1, and the signal level has not been changed until t2. Therefore, as shown in FIG. 2C, the gate voltage V3 is also kept at H-level.

While the gate voltage V3 of the NMOS transistor Q1 is kept at H-level, there is almost no current flow through the resistor R1. Consequently, power dissipation (consumption) in the drive circuit 1 is very small.

Note that the collector voltage V2 of the transistor Q2 is substantially identical to a forward voltage drop VF of the diode D2, which is caused by the collector current.

TIME t2 to t3

Next, as shown in FIG. 2A, as the input signal VIN reduces from positive H-level to OV, the gate of the NMOS transistor Q1 is discharged.

Then, due to speedup effect of the capacitor C1, differential voltage (V3–V1) of the voltage V3 and the voltage V1 is provided to the base of the transistor Q2, thereby turning on the transistor Q2 abruptly.

When the input signal VIN becomes such a small level that a voltage applied to the diode D1 is smaller than the forward voltage drop VF, the diode D1 turns off. As a result, the gate of the NMOS transformer Q1 is discharged slightly to the transformer T1 via the base of the transistor Q2, and discharged mainly by a loop (discharging loop) formed by the resistor R1, the transistor Q2 and the diode D2.

TIME t3 to t4

The input signal VIN, which reached OV at t3, is fixed to OV during a short period till t4. The gate voltage V3 becomes a value of the forward voltage drop VF of the diode D1.

At this period, since the NMOS transistor Q1 is kept off-state, a large level of resonance caused by the inductance of the transformer T1 is unlikely to occur in the drive circuit 1.

TIME t4 to t5

After t4, the input signal VIN is reversed to a negative voltage.

As the input signal VIN reduces from OV, the transistor Q2 turns on again.

At this period, a reverse-direction voltage is applied to the diode D2. Accordingly, current does not flow through the diode D2, but flows along a loop formed by the gate capacitor (Giss), the resistor R1, the emitter of the transistor Q2, the base of the transistor Q2, the resistor R2 and the capacitor C1, the transformer T1 and the source of the NMOS transistor Q1. Then, a reverse bias voltage is applied to the gate of the NMOS transistor Q1.

The reverse bias voltage applied to the gate of the NMOS transistor Q1 is a value obtained by multiplying the input signal VIN by a ratio of the gate capacitance Giss to total impedance calculated with the gate capacitance Giss, the resistors R1 and R2, the capacitor C1 and the inductance of the transformer T1. Therefore, the reverse bias voltage is not very large.

The base current of the transistor Q2 is so small that: power dissipation in the transformer T1 is small; and the above total impedance is large. Consequently, LC resonance is unlikely to occur.

For example, provided that current amplification β of the transistor Q2 is 100, the base current value of the transistor Q2 is merely $\frac{1}{100}$ of a value of current that flows through the resistor R1.

TIME t5 to t6

During t5 to t6, the input signal VIN is kept at a negative level. As a result, the reverse bias voltage has been applied to the gate of the NMOS transistor Q1.

Discharge of the capacitor C1 has ended, during t4 to t5, by a current that flowed through the gate capacitor (Giss), the resistor R1, the emitter of the transistor Q2, the base of the transistor Q2, the resistor R2 and the capacitor C1. Therefore, as shown in FIG. 2C, a value of the reverse bias voltage does not change largely. Therefore, there is no power dissipation in the transformer T1. Moreover, the NMOS transistor Q1 is kept off-state stably and does not turn on by malfunction.

TIME t6 to t7

During t6 to t7, in response to a rise of the input signal VIN, as shown in FIG. 2A, the secondary voltage V1 of the transformer T1 rises abruptly from negative H-level to OV. This allows the secondary voltage V1 of the transformer T1 to exceed the gate voltage V3 of the NMOS transistor Q1. As a result, in a similar manner to the operation during t0 to t1, the gate of the NMOS transistor Q1 is charged, limiting the charging speed by the resistor R1, thereby canceling the reverse bias voltage.

During the period, as described above, the reverse bias voltage according to the impedance of the gate capacitor (Giss) is small, thereby limiting peak current and overshoot of the gate voltage that appear in charging the gate.

TIME t7 to t8

Next, during t7 to t8, the input voltage VIN is kept at OV. Then, the gate voltage V3 of the NMOS transistor Q1 becomes OV, which keeps the NMOS transistor Q1 off-state. As described above, the overshoot of the gate voltage, which appears at t7, is small. Therefore, a large level of resonance caused by the inductance of the transformer T1 is unlikely to occur.

As explained above, the drive circuit 1 according to the present embodiment has the resistor R1 connected between one terminal of the secondary winding of the transformer T1 and the gate of the NMOS transistor Q1. Therefore, a rise time of the gate voltage V3 becomes easily adjustable by adjusting a value of the resistor R1.

Specifically, when a so-called "soft-switching" is performed in ZVS (Zero Volt Switching) system, noise accompanied by peak current is unlikely to occur in charging the gate capacitor (Giss), because a required rise time of a drive voltage is long.

Moreover, the drive circuit 1 according to the present embodiment has the diode D2 connected between the collector of the transistor Q2 and the source (reference potential) of the NMOS transistor Q1 in such a way that a reverse-direction voltage is applied when the input voltage VIN is negative. Therefore, it becomes possible to apply a reverse bias voltage that depends on the resistors R1 and R2, the capacitor C1 and the transformer T1 via the transistor Q2, to the NMOS transistor Q1.

The base current of the transistor Q2 is so small that power dissipation in the transformer T1 is small. Further, as the total impedance in a resonant circuitry is large, a level of LC resonance can be limited.

The generated reverse bias voltage is not very large. Therefore, it becomes possible to limit peak current and overshoot of the gate voltage that appear in charging the gate of the NMOS transistor Q1. Consequently, a large level of resonance caused by the inductance of the transformer T1 is unlikely to occur.

SECOND EMBODIMENT

Next, a drive circuit 1a according to the second embodiment will be described.

Figure 3:
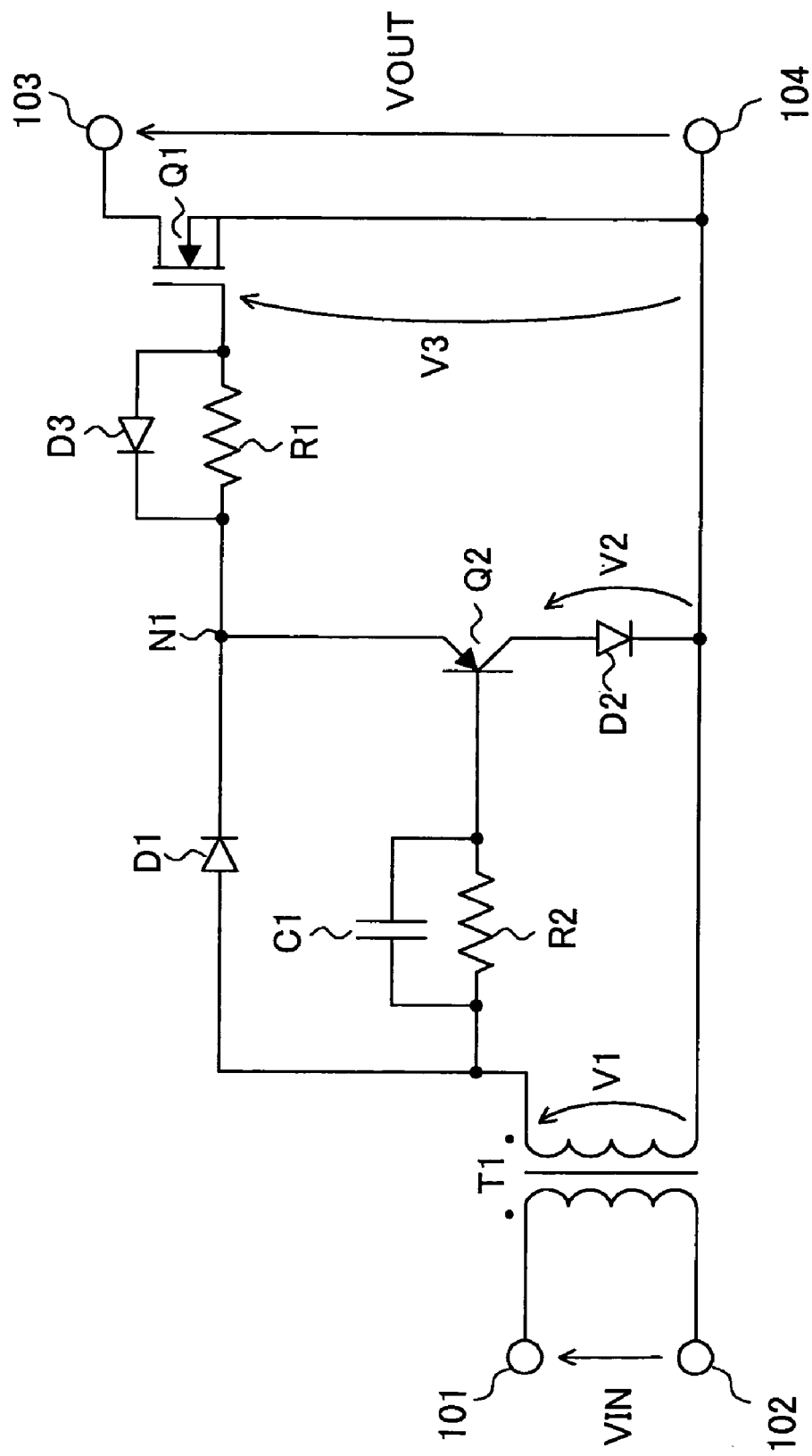
FIG. 3 is a circuit diagram of a drive circuit according to a second embodiment of the present invention.

FIG. 3 shows a circuit diagram of the drive circuit 1a according to the second embodiment. Note that, the parts in FIG. 3 have the same symbol as that of the parts in the drive circuit 1 (first embodiment) in FIG. 1 when they are the same.

The drive circuit 1a according to the present embodiment is, compared to the above drive circuit 1 according to the first embodiment, is to shorten rise time of the gate voltage V3 of the NMOS transistor Q1 and to further reduce power dissipation.

As obviously shown in FIG. 1 and FIG. 3, the drive circuit 1a according to the present embodiment is different from the drive circuit 1 according to the first embodiment, in adding a diode D3 in parallel with the resistor R1 connected to the NMOS transistor Q1.

Figure 2:
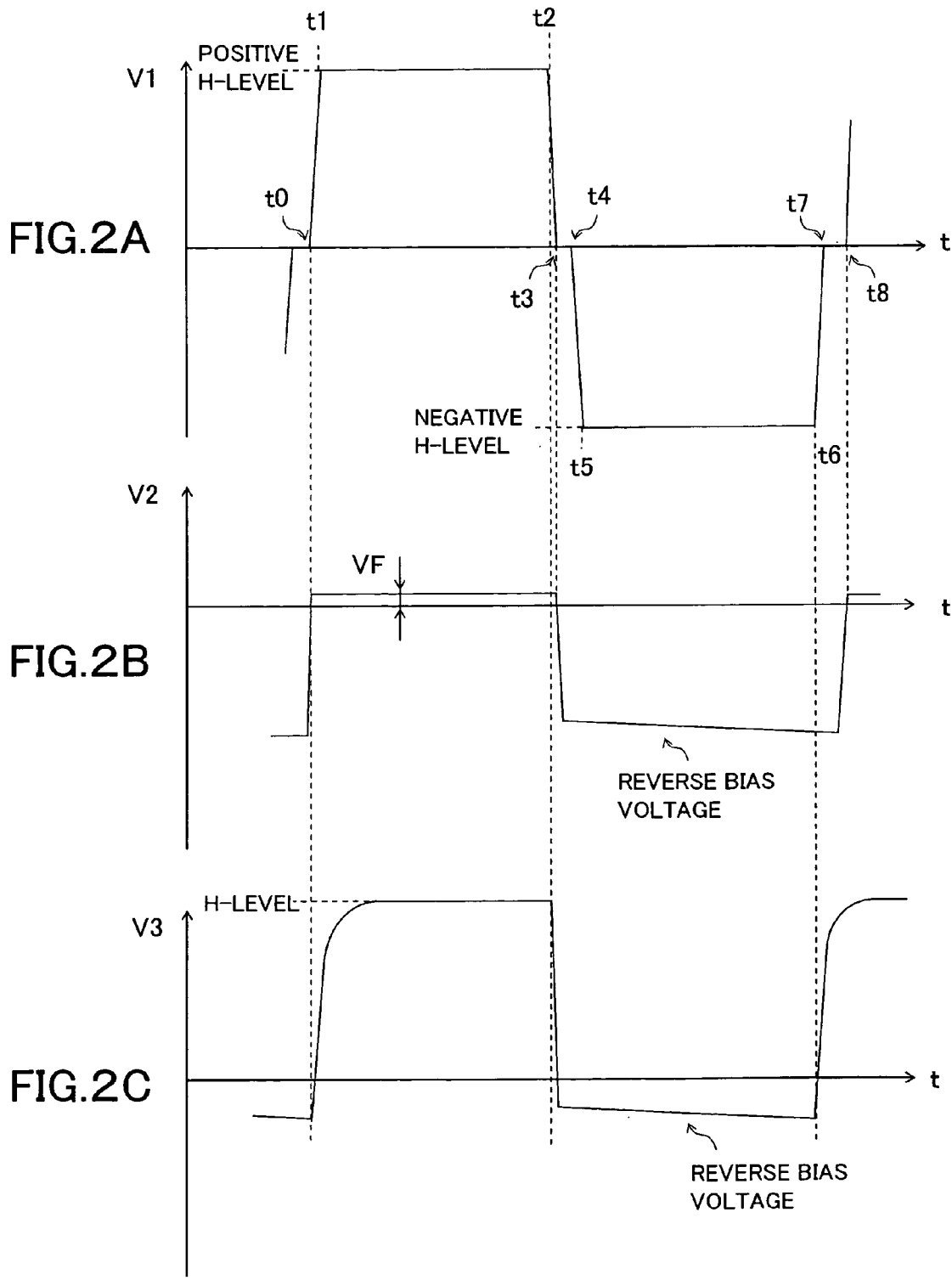
FIG. 2A is a timing chart of secondary voltage V1 of transformer T1 in FIG. 1.
FIG. 2B is a timing chart of collector voltage V2 of transistor Q2 in FIG. 1.
FIG. 2C is a timing chart of gate voltage V3 of transistor Q2 in FIG. 1.

Below, differences will be described in operation compared to the drive circuit 1 with reference to FIG. 2.

TIME t0 to t2

As shown in FIG. 3, the diode D3 is reversely connected to the secondary voltage V1 of the transformer T1. Therefore, during t0 to t2 in FIG. 2, the gate capacitor (Giss) of the NMOS transistor Q1 is charged via the resistor R1. This is the same operation as the drive circuit 1 according to the first embodiment.

TIME t2 to t3

Next, during t2 to t3, the input signal VIN reduces from positive H-level. When the input signal VIN becomes such a low level that a voltage applied to the diode D1 is lower than the forward voltage drop VF, the diode D1 turns off. As a result, the gate of the NMOS transistor Q1 is discharged slightly to the transformer T1 via the base of the transistor Q2, and quickly discharged mainly by a loop (discharging loop) formed by the diode D3, the transistor Q2 and the diode D2. Therefore, it becomes possible to abruptly turn off the NMOS transistor Q1.

During this period, as the resistor R1 is bypassed by the diode D3, there are no resistances, which would be factors of time constant, in the discharging loop. Therefore, fall time of the gate voltage is almost zero and almost no power is dissipated in the transformer T1.

TIME t3 to t4

During t3 to t4, as there is no change in the input signal VIN, an operation is the same as the drive circuit 1 according to the first embodiment.

TIME t4 to t5

At t4, the input signal VIN reverses to a negative voltage. Then, in a similar manner to the drive circuit 1, the transistor Q2 turns on as the input signal VIN reduces from OV.

At this period, current flows along a loop formed by the gate capacitor (Giss), the diode D3, the emitter of the transistor Q2, the base of the transistor Q2, the resistor R2 and the capacitor C1, the transformer T1 and the source of the NMOS transistor Q1. Then, a reverse bias voltage is applied to the gate of the NMOS transistor Q1.

The reverse bias voltage applied to the gate of the NMOS transistor Q1 is a value obtained by multiplying the input signal VIN by a ratio of the gate capacitance Giss to total impedance calculated with the gate capacitance Giss, the resistors R1 and R2, the capacitor C1 and the inductance of the transformer T1. A value of the reverse bias voltage may change compared to that in the first embodiment, as the resistor R1 is not considered in the total impedance. Nevertheless, the reverse bias voltage is stably applied to the NMOS transistor Q1.

TIME t5 to t6

During t5 to t6, in a similar manner to the drive circuit 1 according to the first embodiment, the reverse bias voltage has been applied to the gate of the NMOS transistor Q1.

As discharge of the capacitor C1 has ended, the reverse bias voltage has been applied stably to the NMOS transistor Q1. An operation in this period is the same as the drive circuit 1 according to the first embodiment.

TIME t6 to t7

During t6 to t7, the secondary voltage V1 of the transformer T1 exceeds the gate voltage V3 of the NMOS transistor Q1. Then, the gate of the NMOS transistor Q1 is charged, limiting the charging speed by the resistor R1. Therefore, current does not flow through the diode D3, as it is connected reversely to the input voltage. An operation in this period is the same as the drive circuit 1 according to the first embodiment.

During the period, the reverse bias voltage according to the impedance of the gate capacitor (Giss) is small, thereby limiting peak current and overshoot of gate voltage that appear in charging the gate. This is a similar manner to the drive circuit 1 according to the first embodiment.

TIME t7 to t8

Next, during t7 to t8, the input voltage VIN is kept at OV. Then, the NMOS transistor Q1 is kept off-state regardless of adding the diode D3 in a similar manner to the drive circuit 1 according to the first embodiment.

Note that as the overshoot of the gate voltage, which appears at t7, is small, a large level of resonance caused by the inductance of the transformer T1 is unlikely to occur in the drive circuit 1. This is a similar manner to the drive circuit 1 according to the first embodiment.

As explained above, the drive circuit 1a according to the present embodiment further has the diode D3, compared to the drive circuit 1 according to the first embodiment, which is connected in parallel with the resistor R1. Then, the gate capacitor (Giss) of the NMOS transistor Q1 is quickly discharged, bypassing the resistor R1, thereby turning off the NMOS transistor Q1 at a high speed. Therefore, it becomes possible to further reduce power dissipation in the drive circuit 1a.

The drive circuit 1a according to the present embodiment is very effective in operating a switch element at a high speed.

THIRD EMBODIMENT

Next, a drive circuit 1b according to the third embodiment will be described.

Figure 4:
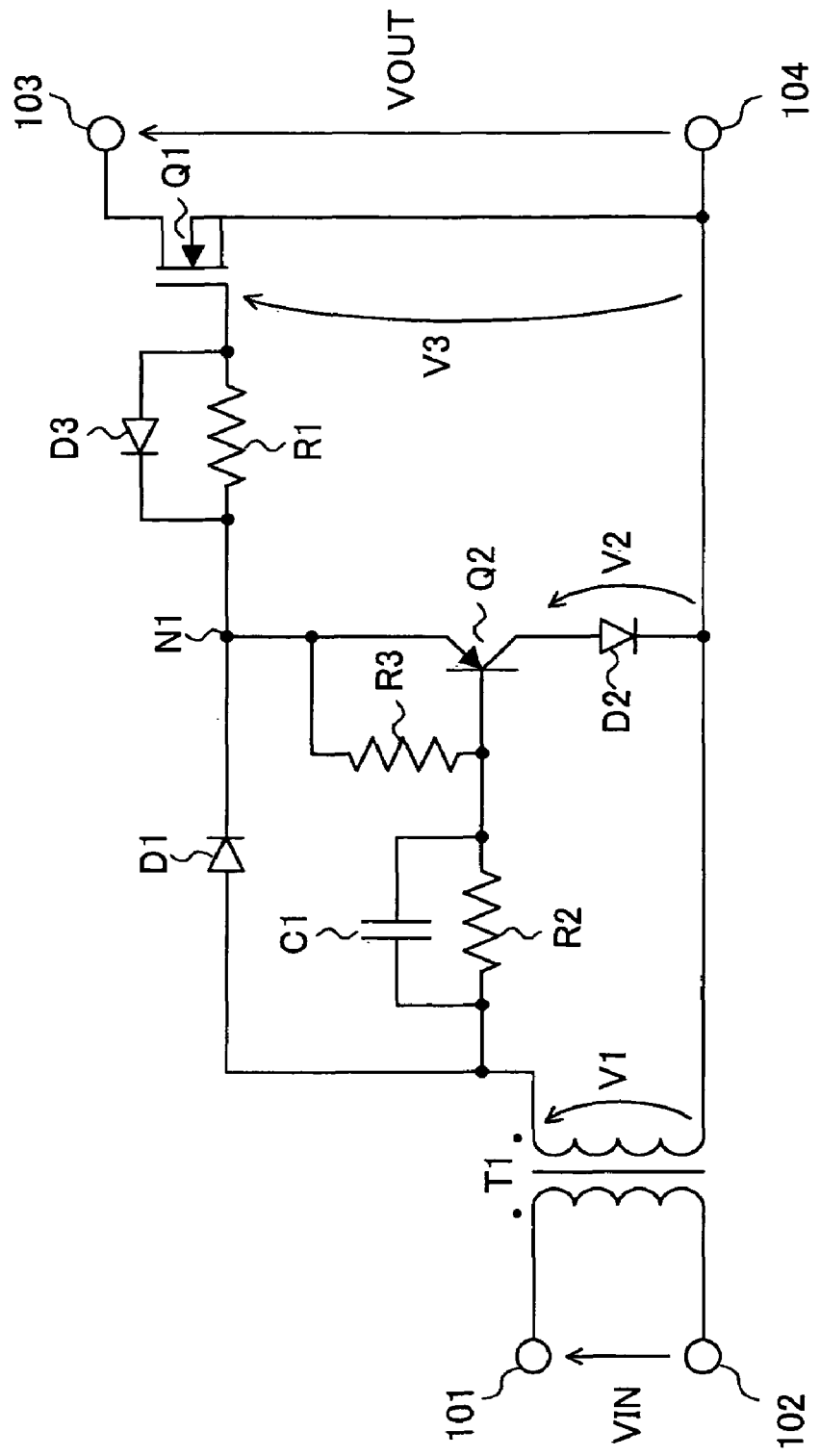
FIG. 4 is a circuit diagram of a drive circuit according to a third embodiment of the present invention.

FIG. 4 shows a circuit diagram of the drive circuit 1b according to the third embodiment. Note that, the parts in FIG. 4 have the same symbol as that of the parts in the drive circuit 1a (second embodiment) in FIG. 3 when they are the same.

As obviously shown by FIG. 3 and FIG. 4, the drive circuit 1b according to the present embodiment is different from the drive circuit 1a according to the second embodiment, in adding a resistor R3 between the emitter and the base of the transistor Q2.

Generally, when a bipolar type transistor functions as a switch, delay time of the switching becomes longer under high temperature environment.

In the present embodiment, as shown in FIG. 4, the resistor R3 is added between the emitter and the base of the transistor Q2, thereby stabilizing a bias voltage between the emitter and the base and shortening the delay time.

Therefore, the drive circuit 1b according to the present embodiment operates even under high temperature environment in a similar manner to normal temperature environment. For example, it is usable under extensive temperature range such as −40 deg to +105 deg or the like.

Note that drive circuits according to the above embodiments are widely applicable to drive circuits in power supply apparatuses. For example, they are preferably applicable to power supply apparatuses that generate a desired DC voltage by turning on/off a voltage-driven type switch element.

It should be understood by those skilled in the art that various modifications, combinations, sub-combinations and alternations may occur depending on design requirements and other factors insofar as they are within the scope of the appended claims or the equivalent thereof.

What is claimed is:

1. A drive circuit comprising:
   a transformer having a primary winding to which a pulse is applied and a secondary winding, the secondary winding having one terminal connected to a reference terminal;
   a first switch element having a first control terminal, and switching between an output terminal and the reference terminal in response to said pulse;
   a first node provided between the other terminal of the secondary winding of the transformer and the first control terminal;
   a first diode connected between the other terminal of the secondary winding of the transformer and the first node;
   a first resistor connected between the first node and the first control terminal;
   a second diode, one terminal of the second diode connected to the reference terminal;
   a second switch element connected between the first node and the other terminal of the second diode, having a second control terminal and controlling a current flow of the second diode;
   a capacitor; and
   a second resistor, the capacitor and the second resistor being connected in parallel each other between the other terminal of the secondary winding of the transformer and the second control terminal.

2. A drive circuit as set forth in claim 1, further comprising a third diode of which permitted current flow is opposite to that of the first diode, the third diode connected in parallel with the first resistor.

3. A drive circuit as set forth in claim 1, further comprising a third resistor connected between the second control terminal and the first node.

4. A drive circuit as set forth in claim 1, wherein the second switch element is a bipolar type transistor.

5. A power supply apparatus comprising:
   a transformer having a primary winding to which a pulse is applied and a secondary winding, the secondary winding having one terminal connected to a reference terminal;
   a first switch element having a first control terminal, and switching between an output terminal and the reference terminal in response to said pulse;
   a first node provided between the other terminal of the secondary winding of the transformer and the first control terminal;
   a first diode connected between the other terminal of the secondary winding of the transformer and the first node;
   a first resistor connected between the first node and the first control terminal;
   a second diode, one terminal of the second diode connected to the reference terminal;
   a second switch element connected between the first node and the other terminal of the second diode, having a second control terminal and controlling a current flow of the second diode;
   a capacitor; and
   a second resistor, the capacitor and the second resistor being connected in parallel each other between the other terminal of the secondary winding of the transformer and the second control terminal,
   wherein a desired DC voltage is generated based on the voltage of said output terminal.

* * * * *